(12) United States Patent
Yamauchi

(10) Patent No.: US 6,711,044 B2
(45) Date of Patent: Mar. 23, 2004

(54) SEMICONDUCTOR MEMORY DEVICE WITH A COUNTERMEASURE TO A SIGNAL DELAY

(75) Inventor: Hiroyuki Yamauchi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/171,790

(22) Filed: Jun. 17, 2002

(65) Prior Publication Data

US 2003/0001233 A1 Jan. 2, 2003

(30) Foreign Application Priority Data

Jul. 2, 2001 (JP) .......................................... 2001-200583

(51) Int. Cl.[7] ............................................... G11C 5/06
(52) U.S. Cl. .......................................... 365/63; 365/196
(58) Field of Search ..................... 365/63, 196; 257/776

(56) References Cited

U.S. PATENT DOCUMENTS 5,821,592 A   10/1998   Hoenigschmid et al. .... 257/390
5,864,181 A * 1/1999   Keeth ........................ 257/776

FOREIGN PATENT DOCUMENTS

| JP | 6-216341 | 8/1994 |
| JP | 9-270468 | 10/1997 |
| JP | 10-93032 | 4/1998 |
| JP | 10-178110 | 6/1998 |

* cited by examiner

Primary Examiner—M. Tran
(74) Attorney, Agent, or Firm—McDermott, Will & Emery

(57) ABSTRACT

A semiconductor memory device of the present invention includes: a substrate; a plurality of memory cells arranged in a matrix pattern on a primary surface of the substrate; a sense amplifier provided in each column for detecting data of the memory cells that are arranged along the column; a plurality of wiring layers formed on the substrate; and a plurality of data lines provided in each column and connected to the memory cells that are arranged in the column, wherein the data lines are connected commonly to the sense amplifier but via different paths, and a data line having a longer path length is provided by using a wiring layer that is on a higher level.

13 Claims, 13 Drawing Sheets

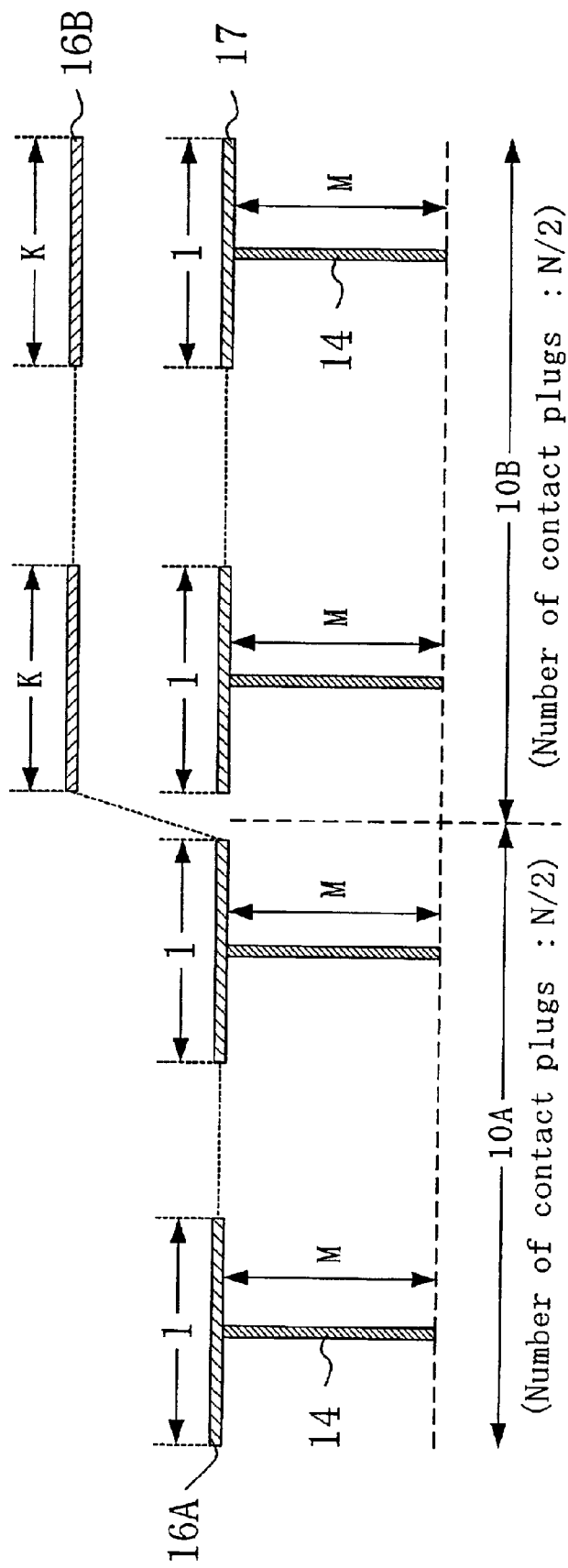

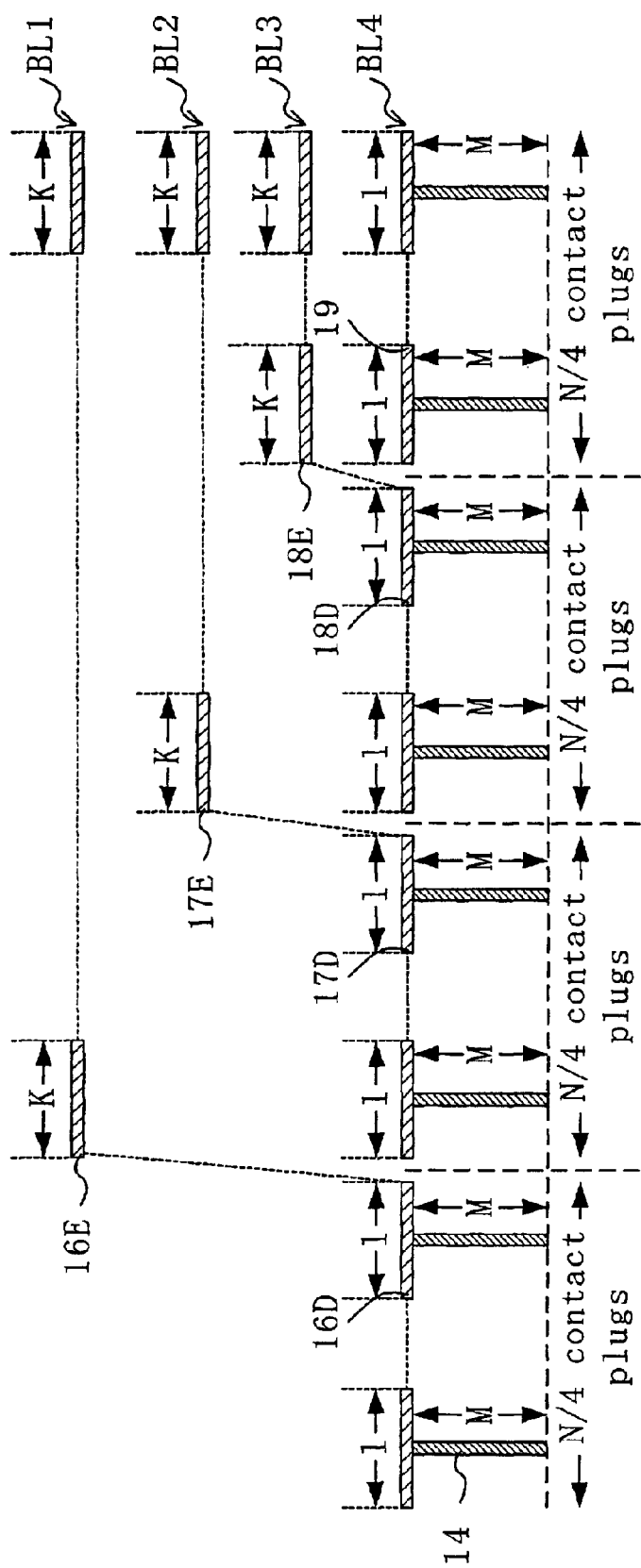

1000

Longitudinal-type cell

SEMICONDUCTOR MEMORY DEVICE WITH A COUNTERMEASURE TO A SIGNAL DELAY

BACKGROUND OF THE INVENTION

The present invention relates to a semiconductor memory device, and more particularly to a countermeasure to a signal delay in such a device.

Japanese Laid-Open Patent Publication No. 10-178110 and Japanese Laid-Open Patent Publication No. 9-270468 each disclose a layout of a 6-transistor SRAM memory cell (i.e., a memory cell of an SRAM device including six transistors). Specifically, each of these publications discloses a method for reducing the aspect ratio (defined herein as the ratio of the dimension in the row direction in which word lines extend with respect to the dimension in the column direction in which bit lines extend) of a 6-transistor SRAM memory cell as illustrated in FIG. 11A, i.e., a method for laying out the components of the memory cell so that the dimension of the memory cell in the row direction in which word lines extend is greater than that in the column direction in which bit lines extend.

Specifically, each of these publications discloses a layout in which P-wells 102a and 102b are arranged on opposite sides of an N-well 101 so as to interpose the N-well 101 therebetween, as illustrated in FIG. 11B. In this layout, six transistors (MN0, MN1, MN2, MN3, MP0 and MP1) are arranged substantially in point symmetry with respect to a central point $P_{100}$ of the memory cell.

In the layout of a memory cell 1000 illustrated in FIG. 11A and FIG. 11B, bit lines BL and BL are arranged on the P-well 102a and the P-well 102b, respectively. The drive transistors MN0 and MN1, which are NMOS transistors, are laid out substantially in point symmetry with respect to the central point $P_{100}$ of the memory cell 1000 as described above, and are arranged over the P-well 102a and the P-well 102b, respectively. The access transistors MN2 and MN3, which are NMOS transistors, are also laid out substantially in point symmetry with respect to the central point $P_{100}$ of the memory cell 1000 as described above, and are arranged over the P-well 102a and the P-well 102b, respectively. Moreover, the load transistors MP0 and MP1, which are PMOS transistors, are also laid out substantially in point symmetry with respect to the central point $P_{100}$ of the memory cell 1000, and are both arranged over the N-well 101. The load transistors MP0 and MP1 extend in two lines parallel to each other in the direction in which bit lines extend, whereby the width of the PMOS region (the width of the N-well 101) is increased accordingly.

FIG. 12A is a top view schematically illustrating a structure of an SRAM device in which the memory cells 1000 illustrated in FIG. 11A and FIG. 11B are arranged in a matrix pattern, and FIG. 12B is a cross-sectional view illustrating a bit line provided along line X—X shown in FIG. 12A.

FIG. 13A is a top view schematically illustrating a structure of another SRAM device in which high-aspect-ratio memory cells (longitudinal-type cells) are arranged in a matrix pattern, and FIG. 13B is a cross-sectional view illustrating a bit line provided along line Y—Y shown in FIG. 13A.

Assuming that the memory cells illustrated in FIG. 12A and FIG. 13A are made with the same design rule, the SRAM device illustrated in FIG. 12A, which uses the memory cells 1000, has a smaller dimension in the column direction in which bit lines extend, as compared to the SRAM device illustrated in FIG. 13A, which uses the longitudinal-type cells. Thus, as can be seen from a comparison between FIG. 12A and FIG. 13A, the length of the bit line can be reduced in the SRAM device illustrated in FIG. 12A, which uses the memory cells 1000, as compared to the SRAM device illustrated in FIG. 13A, which uses the longitudinal-type cells. In practice, the length of the bit line of the SRAM device illustrated in FIG. 12A, which uses the memory cells 1000, is about ⅓ of that of the bit line of the SRAM device illustrated in FIG. 13A, which uses the longitudinal-type cells.

Each bit line provided in a semiconductor memory device includes a portion ("extended portion") that extends in the column direction of the matrix pattern in which a plurality of memory cells are arranged, and another portion ("contact plug") that is connected to an access transistor of each memory cell. Therefore, if the number of contact plugs increase along with an increase in the degree of integration of memory cells, the capacitance of the contact plugs increases, thereby increasing the total line capacitance of the bit line. For example, in SRAM devices, highly-integrated mask ROM device, etc., using memory cells having a small ratio of the dimension in the direction in which word lines extend with respect to the dimension in the direction in which bit lines extend (longitudinal-type cells), the proportion of the contact plug capacitance with respect to the total line capacitance of the bit line is particularly large, and thus the bit line delay is substantial.

However, with the conventional method as described above, the length of a contact plug between a transistor and the extended portion of a bit line cannot be changed. Therefore, it is not very effective in reducing the total line capacitance of a bit line. In other words, it is not very effective in reducing the bit line delay. This will now be described in detail.

Typically, the length of a contact plug running through one wiring layer is 1300 nm, and the total length of a contact plug running through three wiring layers is 3900 nm. In the SRAM device illustrated in FIG. 13A, which uses longitudinal-type cells, the length of the extended portion of a bit line per two memory cells (the dimension in the column direction of the memory cells) is about 1700 nm. In a case where one bit line includes one contact plug per two memory cells, the total of the length of the extended portion of the bit line per two memory cells and the length of the contact plug is 5600 nm (1700 nm+3900 nm).

Using the memory cell 1000 illustrated in FIG. 12A, if the length of a bit line is reduced to ⅓, the total of the length of the bit line and the length of the contact plug will be about 4460 nm. Since the length of the contact plug does not change, the total of the length of the extended portion of the bit line and the length of the contact plug is reduced only by about 20%. Thus, the total line capacitance of the bit line is reduced only by about 20%.

SUMMARY OF THE INVENTION

The present invention, which has been made to solve the problem as described above, has an object to reduce a signal delay in a semiconductor memory device.

A semiconductor memory device of the present invention includes: a substrate; a plurality of memory cells arranged in a matrix pattern on a primary surface of the substrate; a sense amplifier provided in each column for detecting data of the memory cells that are arranged along the column; a plurality of wiring layers formed on the substrate; and a plurality of data lines provided in each column and connected to the memory cells that are arranged in the column, wherein the data lines are connected commonly to the sense amplifier but via different paths, and a data line having a longer path length is provided by using a wiring layer that is on a higher level.

With the present invention, the number of memory cells connected to one data line is reduced. Therefore, the number of contact plugs for connecting memory cells and one data line is reduced. Thus, the total line capacitance of each data line including the contact plugs is reduced. Since the line capacitance is in proportion to the signal delay along the line, the signal delay along one data line is reduced by the reduction in the total line capacitance of the data line including the contact plugs.

It is preferred that: the plurality of data lines each include contact plugs for connection to the plurality of memory cells that are arranged in one column; and a total line capacitance of each data line including the contact plugs is substantially equal to those of the other data lines.

In this way, the variations in signal delay time among different data lines are suppressed.

It is preferred that in two data lines that are provided by using an upper wiring layer and a lower wiring layer vertically adjacent to the upper wiring layer, among the plurality of wiring layers, a portion provided through the upper wiring layer is offset from another portion provided through the lower wiring layer as viewed from above.

In this way, in the two data lines that are provided by using the upper wiring layer and the lower wiring layer vertically adjacent to the upper wiring layer, the distance between the portion provided through the upper wiring layer and the other portion provided through the lower wiring layer can be increased, thereby reducing the coupling capacitance occurring between the portion provided through the upper wiring layer and the other portion provided through the lower wiring layer.

It is preferred that: the memory cells each include a memory cell transistor; and a larger cell current flows through the memory cell transistor of a memory cell that is connected to a data line having a longer path length.

A data line having a longer path length has a greater signal delay. Therefore, a memory cell of a higher driving power including a memory cell transistor through which a larger cell current flows is employed as a memory cell connected to such a data line having a longer path length. In this way, the signal delay can be compensated for. Thus, the signal delay can be made uniform among different data lines.

The memory cell transistor of a memory cell that is connected to a data line having a longer path length may have a larger channel width.

The memory cell transistor of a memory cell that is connected to a data line having a longer path length may have a smaller channel length.

The memory cell transistor of a memory cell that is connected to a data line having a longer path length may have a lower threshold voltage.

An amplifier may be provided along the path of at least one of the plurality of data lines.

The plurality of data lines may be connected to the sense amplifier each via a column switch.

Another semiconductor memory device according to the present invention includes: a substrate; a plurality of memory cells arranged in a matrix pattern on a primary surface of the substrate; a sense amplifier provided in each column for detecting data of the memory cells that are arranged along the column; and a data line provided in each column and connected to the memory cells that are arranged in the column, wherein the memory cells each include a memory cell transistor, and a larger cell current flows through the memory cell transistor of a memory cell that is located farther from the sense amplifier.

A data line having a longer path length has a greater signal delay. Therefore, a memory cell of a higher driving power including a memory cell transistor through which a larger cell current flows is employed as a memory cell located farther from the sense amplifier. In this way, the signal delay can be compensated for. Thus, the signal delay can be made uniform between memory cells connected to a single bit line and the sense amplifier.

The memory cell transistor of a memory cell that is located farther from the sense amplifier may have a larger channel width.

The memory cell transistor of a memory cell that is located farther from the sense amplifier may have a smaller channel length.

The memory cell transistor of a memory cell that is located farther from the sense amplifier may have a lower threshold voltage.

BRIEF DESCRIPTION OF THE DRAWINGS

FIG. 4 is a diagram illustrating the line capacitance of a bit line of Embodiment 1.

FIG. 9 is a diagram illustrating the line capacitance of a bit line of Embodiment 2.

DESCRIPTION OF THE PREFERRED EMBODIMENTS

Figure 1A:
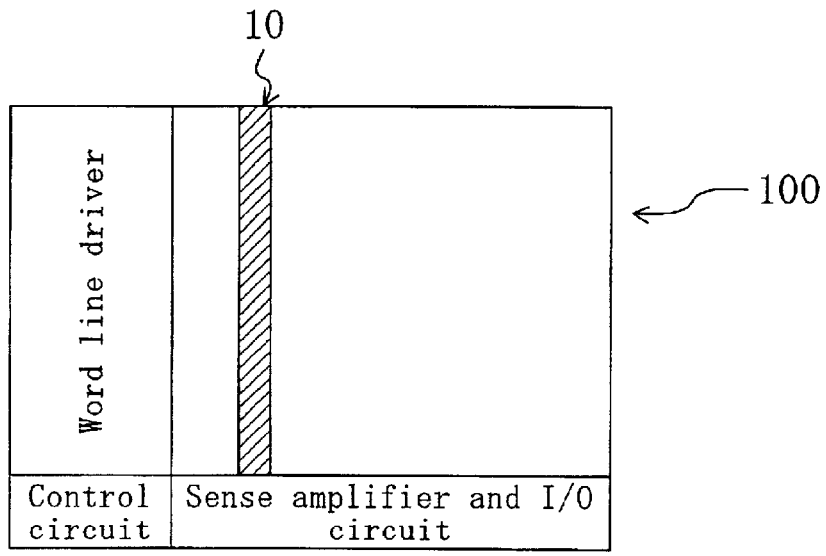
FIG. 1A is a schematic diagram illustrating a structure of an SRAM device of Embodiment 1.

Embodiments of the present invention will now be described with reference to the drawings, in which like elements are denoted by like reference numerals throughout the embodiments for the sake of simplicity.

Embodiment 1

Figure 1B:
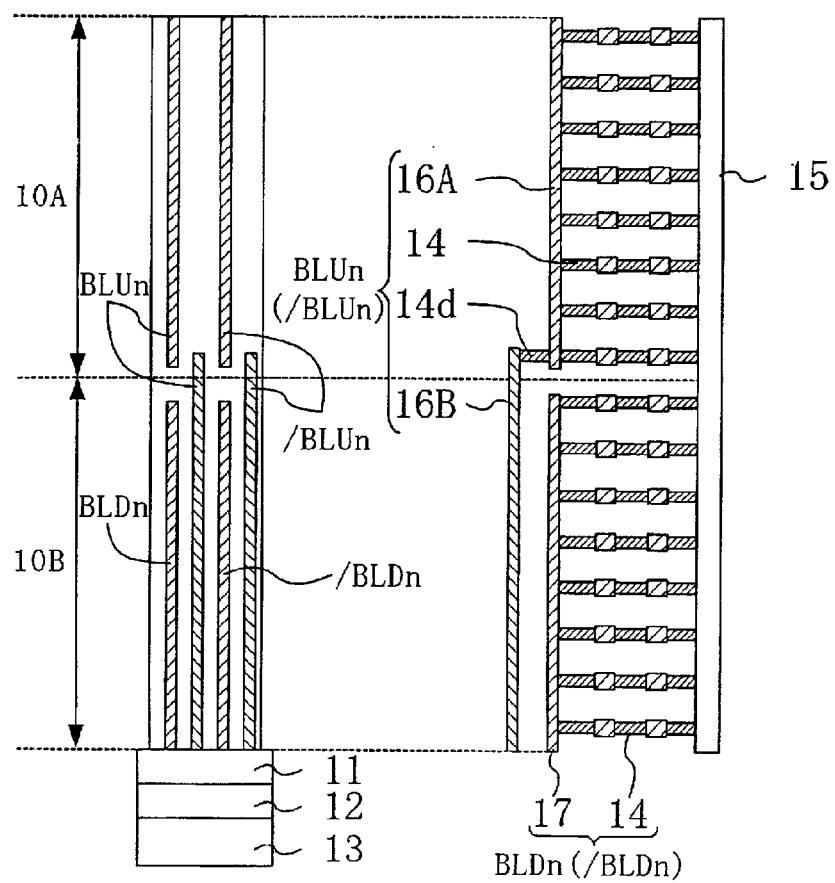
FIG. 1B shows a top view and a cross-sectional view illustrating a structure of bit lines of a memory cell group including a plurality of memory cells that are arranged along a column in the SRAM device of Embodiment 1.

FIG. 1A is a schematic diagram illustrating a structure of an SRAM device 100 of the present embodiment, and FIG. 1B shows a top view and a cross-sectional view illustrating a structure of bit lines of a memory cell group 10 including a plurality of memory cells arranged along a column in the SRAM device 100.

As illustrated in FIG. 1A, the SRAM device 100 of the present embodiment includes a plurality of memory cells arranged in a matrix pattern, word line drivers each connected to a word line (not shown) for performing a row addressing operation via the word line, sense amplifiers and I/O circuits each for exchanging signals with a bit line pair (not shown), and a control circuit for controlling the word line drivers and the I/O circuits.

As illustrated in the top view of FIG. 1B, two bit line pairs (BLUn, /BLUn) and (BLDn, /BLDn) are provided in the memory cell group 10 including a plurality of memory cells arranged in a column. In each bit line pair, two bit lines are arranged in parallel to each other with a constant interval therebetween and are connected to a column switch 11. The column switch 11 is connected to a sense amplifier 12, and the sense amplifier 12 is connected to an I/O circuit 13.

Next, referring to the cross-sectional view of FIG. 1B, the structure of the bit lines BLUn and BLDn will be described. As illustrated in the cross-sectional view of FIG. 1B, the bit line BLUn includes extended portions 16A and 16B extending in the column direction along the memory cell group 10, and contact plugs 14 each connected to an access transistor (not shown) of a memory cell formed on an Si substrate 15. The bit line BLDn includes an extended portion 17 extending in the column direction along the memory cell group 10, and contact plugs 14 each connected to an access transistor (not shown) of a memory cell formed on the Si substrate 15. The bit lines /BLUn and /BLDn are structurally the same as the bit lines BLUn and BLDn, respectively.

The bit line pair (BLUn, /BLUn) is connected to the memory cells that are included in a region 10A of the memory cell group 10, and the bit line pair (BLDn, /BLDn) is connected to the memory cells that are included in a region 10B of the memory cell group 10. Thus, the memory cell group 10 including memory cells that are located along the same column is divided into the two regions 10A and 10B, and a bit line pair is provided for each of the regions.

The extended portion 16A of the bit line pair (BLUn, /BLUn) is provided in the region 10A and in the same wiring layer as the extended portion 17 of the bit line pair (BLDn, /BLDn) connected to the memory cells in the region 10B. In the region 10B, the extended portion 16B of the bit line pair (BLUn, /BLUn) is provided in another wiring layer on a higher level than the bit line pair (BLDn, /BLDn) connected to the memory cells in the region 10B, and the extended portion 16B is connected to the extended portion 16A of the bit line pair (BLUn, /BLUn) via a contact plug 14d.

Note that in the present embodiment, the extended portion 16B of the bit line BLUn is parallel to the extended portion 17 of the bit line BLDn and is shifted from the extended portion 17 as viewed from above, as illustrated in the top view of FIG. 1B. In other words, the extended portion 16B is offset from the extended portion 17 as viewed from above. The extended portion 16B of the bit line /BLUn is provided in a similar manner. In this way, the distance between the extended portion 16B and the extended portion 17 is increased, whereby it is possible to reduce the coupling capacitance occurring therebetween. Particularly, it is preferred that the extended portion 16B is offset from the extended portion 17 as viewed from above, by a distance that is one half of the distance between each pair of bit lines, as in the present embodiment, because in this way, the distance between the extended portion 16B and the extended portion 17 is maximized.

Figure 2:
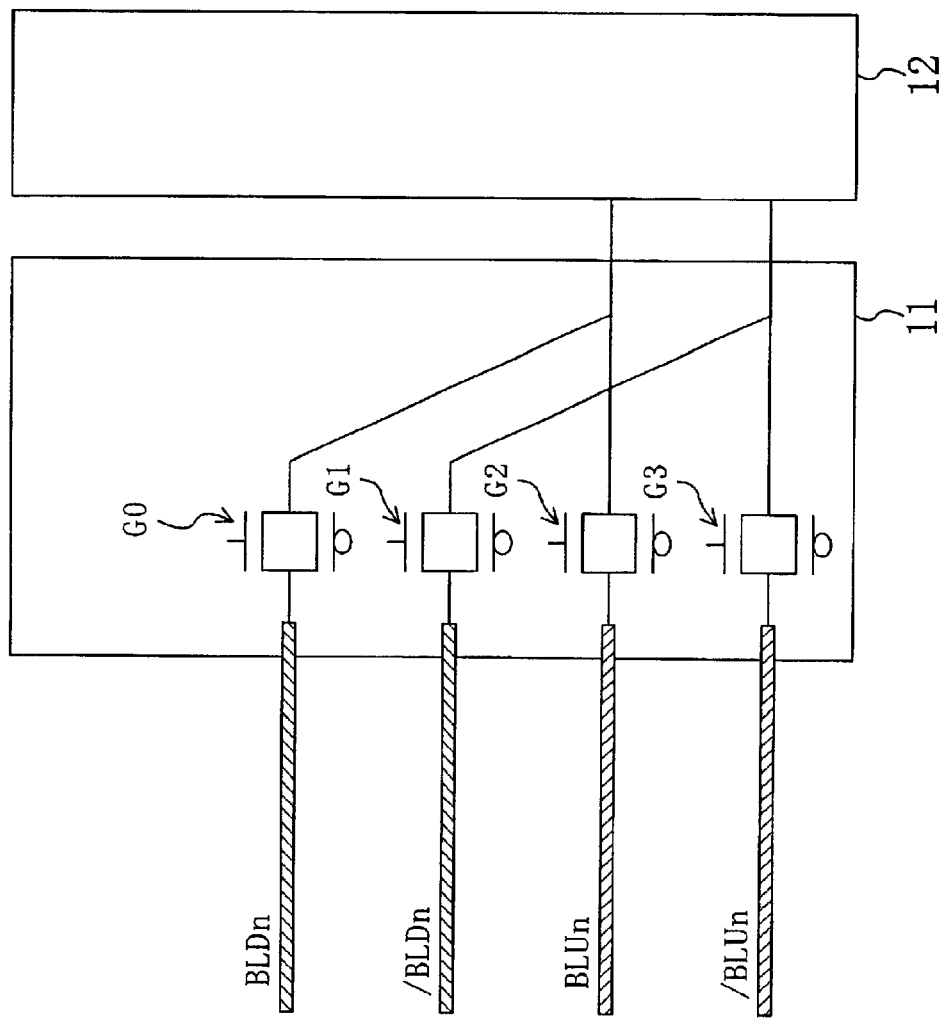
FIG. 2 is a schematic diagram illustrating a structure of bit lines provided in the SRAM device of Embodiment 1.

As illustrated in FIG. 2, the bit line pair (BLUn, /BLUn) and the bit line pair (BLDn, /BLDn) are each connected to the column switch 11. The column switch 11 includes a switch G0, a switch G1, a switch G2 and a switch G3. The bit line BLDn is connected to the switch G0, the bit line /BLDn to the switch G1, the bit line BLUn to the switch G2, and the bit line /BLUn to the switch G3. Thus, by controlling the column switch 11 (i.e., by turning ON/OFF the switches G0 to G3 provided in the column switch 11), it is possible to select one of the bit line pair (BLUn, /BLUn) and the bit line pair (BLDn, /BLDn) to which a selected memory cell is connected.

Note that in the memory cell group 10 including memory cells that are located along the same column, word lines for two memory cells will not be addressed at the same time. Therefore, the bit line pair (BLUn, /BLUn) and the bit line pair (BLDn, /BLDn) will not be addressed at the same time. Thus, the bit line delay is influenced by the line capacitance of one of the bit line pairs (one with the larger line capacitance).

Figure 3A:
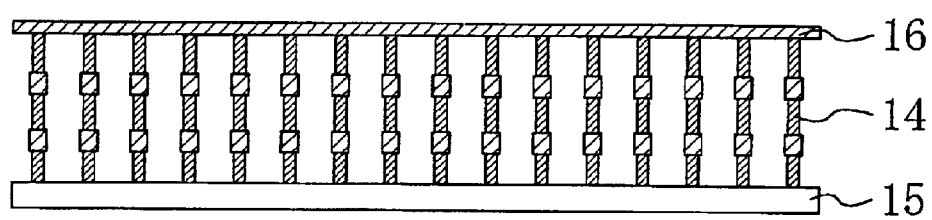
FIG. 3A illustrates a structure of a bit line in a conventional SRAM device.
Figure 3B:
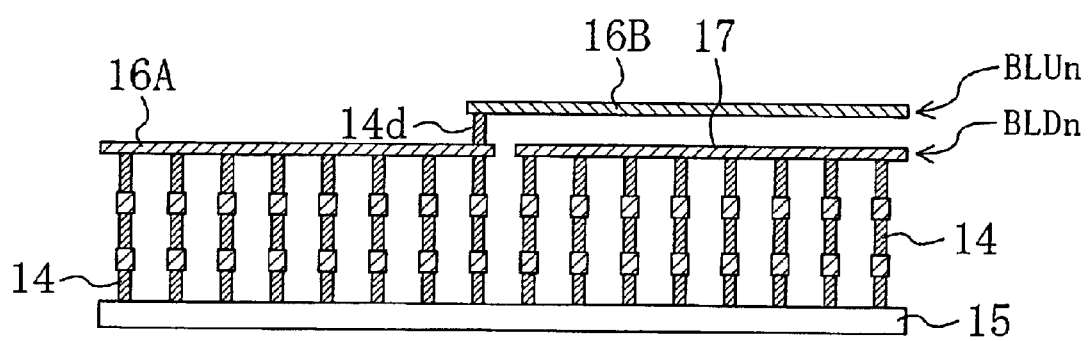
FIG. 3B illustrates a structure of a bit line in the SRAM device of Embodiment 1.

FIG. 3A illustrates a structure of a bit line in a conventional SRAM device, and FIG. 3B illustrates a structure of a bit line in the SRAM device of the present embodiment.

A comparison between FIG. 3A and FIG. 3B shows that the number of contact plugs for one bit line in the present embodiment is one half of that in the prior art. Thus, with the present embodiment, the number of contact plugs for one bit line can be reduced to half. Therefore, the line capacitance of each bit line can be reduced. Note that while the number of contact plugs for one bit line is set to be one half of that in the prior art in the present embodiment, the present invention is not limited to this, as long as two bit lines together include a number of contact plugs that are provided for one bit line in the prior art. In this way, the line capacitance of each bit line can be reduced.

Particularly, an SRAM device using the low-aspect-ratio lateral-type cells has a contact plug density about three times that of an SRAM device using the longitudinal-type cells. Therefore, it is very effective to reduce the bit line delay by reducing the line capacitance of each bit line as in the present embodiment. The effect of reducing the line capacitance of each bit line in the present embodiment with respect to that in the prior art can be quantitatively represented by a model as illustrated in FIG. 4.

The line capacitance of the bit line BLUn of the present embodiment will now be described with reference to FIG. 4. FIG. 4 is a diagram illustrating the line capacitance of the bit line BLUn.

As illustrated in FIG. 4, N/2 contact plugs 14 are provided in the region 10A of the memory cell group 10, and each of the contact plugs 14 is connected to the extended portion 16A of the bit line BLUn. Moreover, N/2 contact plugs 14 are provided also in the region 10B of the memory cell group 10, and each of the contact plugs 14 is connected to the extended portion 17 of the bit line BLDn. Each contact plug 14 is provided for two memory cells.

Where K denotes the line capacitance of the extended portion 16B for two memory cells, and M denotes the line capacitance of the contact plug 14, with respect to the line capacitance of the extended portions 16A and 17 for one contact plug (for two memory cells) being 1, the line capacitance $C_{BLUn}$ of the bit line BLUn is represented by Expression 1 below. Note that the line capacitance of the contact plug 14d is negligible and is thus ignored herein.

$$C_{BLUn} = (1+K+M) \times N/2 \quad \text{(Expression 1)}$$

On the other hand, the line capacitance $C_{BL}$ of a bit line provided in the conventional SRAM device is represented by Expression 2 below.

$$C_{BL} = (1+M) \times N \quad \text{(Expression 2)}$$

Therefore, the ratio $C_{BLUn}/C_{BL}$ of the reduced line capacitance of each bit line in the present embodiment with respect to that in the prior art can be represented by Expression 3 below.

$$C_{BLUn}/C_{BL} = (1+K+M) \times N / (1+M) \times 2N \quad \text{(Expression 3)}$$

Note that the line capacitance of the bit line BLDn is $(1+M) \times N/2$, and is smaller than the line capacitance of the bit line BLUn. Therefore, the effect of reducing the line capacitance of each bit line in the present embodiment is dependent on the bit line BLUn.

Figure 10B:
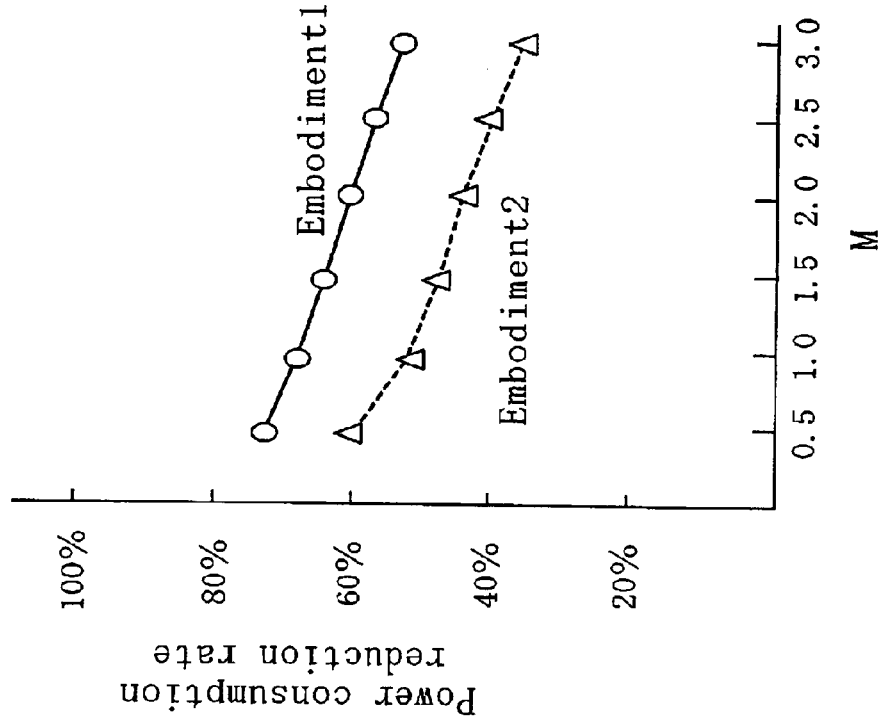
FIG. 10B is a graph illustrating the effect of reducing the power consumption according to Embodiment 1 and Embodiment 2.
Figure 10A:
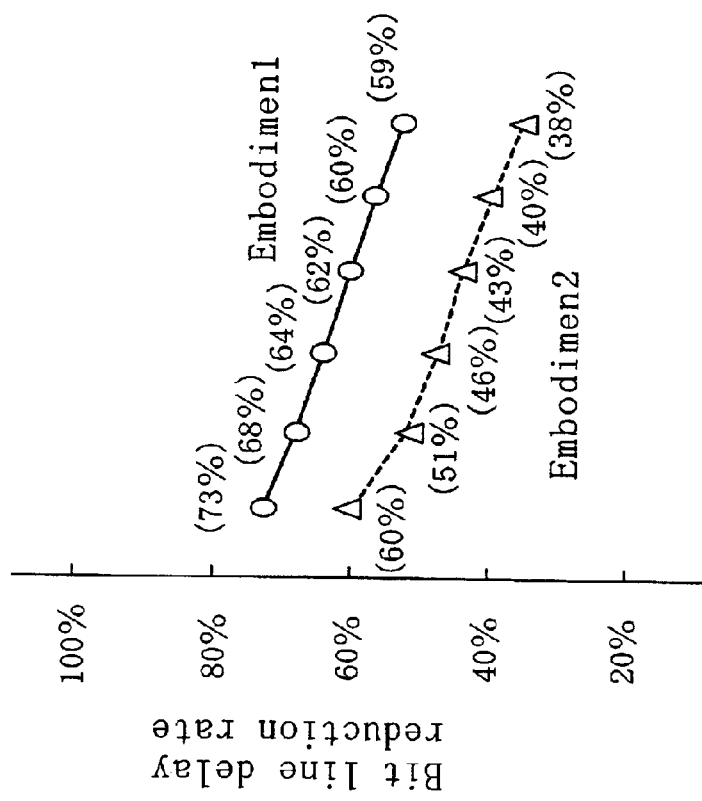
FIG. 10A is a graph illustrating the effect of reducing the bit line delay according to Embodiment 1 and Embodiment 2.
Figure 11A:
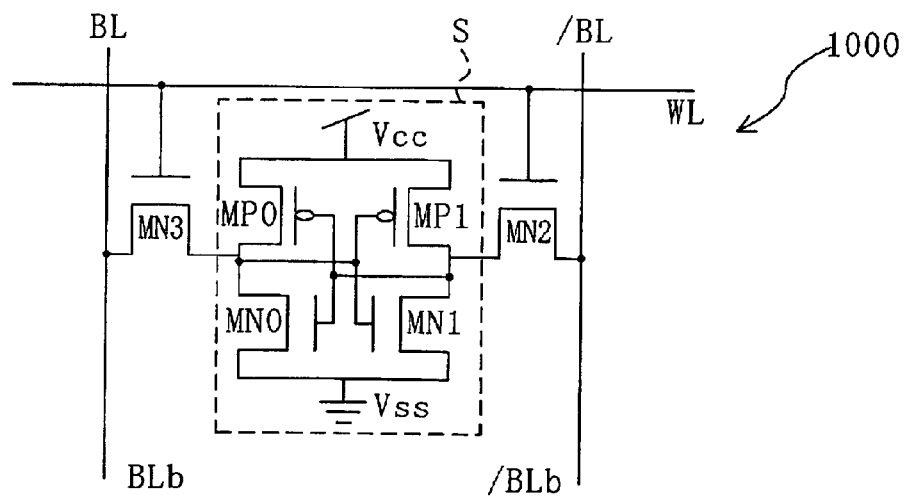
FIG. 11A illustrates a circuit diagram of a memory cell provided in a conventional SRAM device.
Figure 11B:
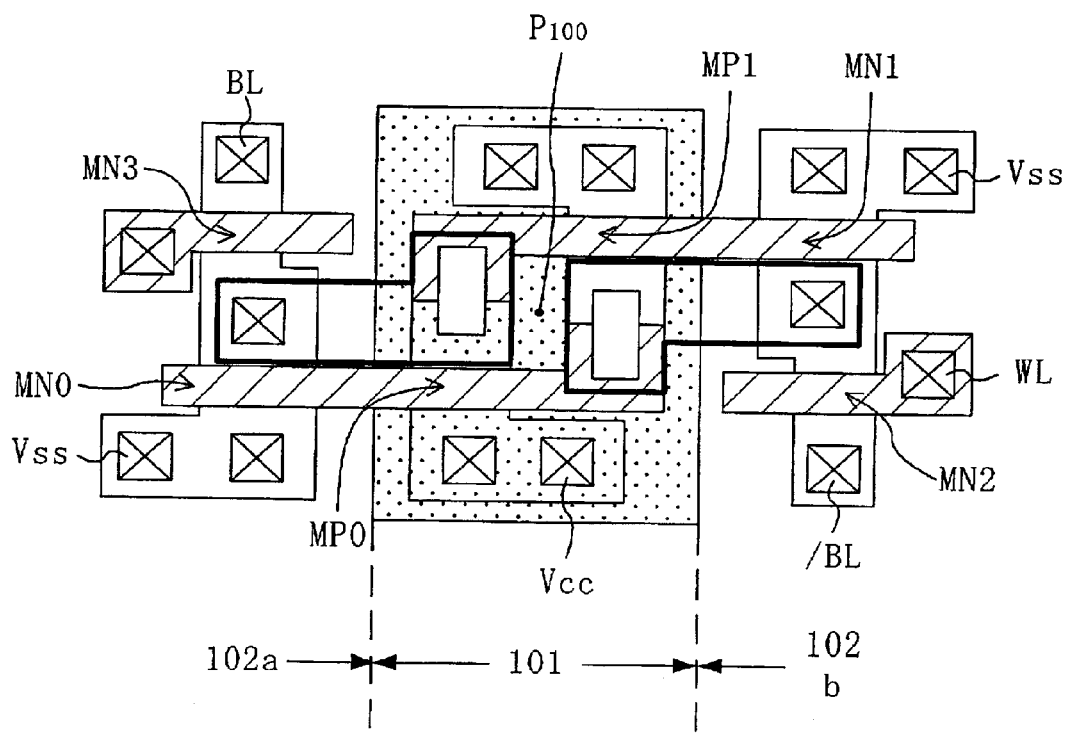
FIG. 11B illustrates a schematic top view of a layout of the memory cell.
Figure 12A:
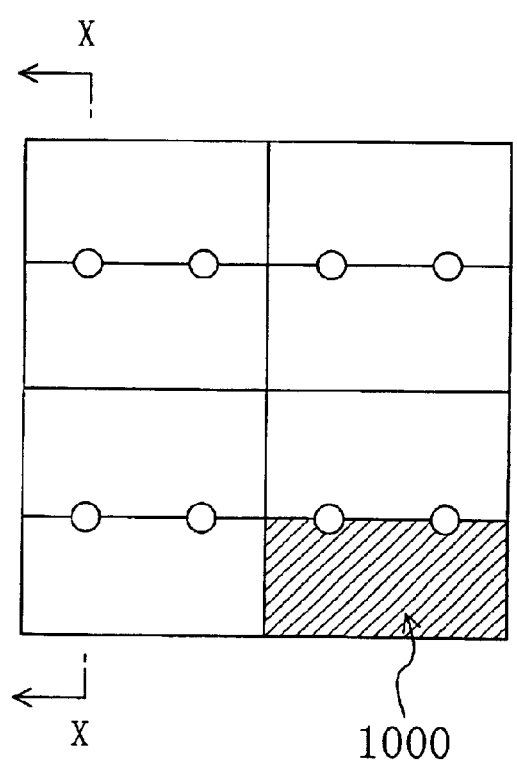
FIG. 12A is a top view schematically illustrating a structure of an SRAM device in which the memory cells as illustrated in FIG. 11A and FIG. 11B are arranged in a matrix pattern.
Figure 12B:
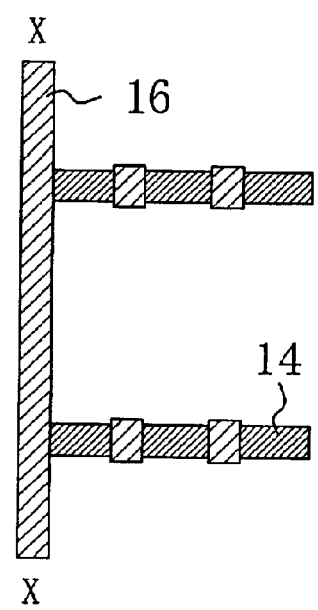
FIG. 12B is a cross-sectional view of a bit line that is provided along line X—X shown in FIG. 12A.
Figure 13A:
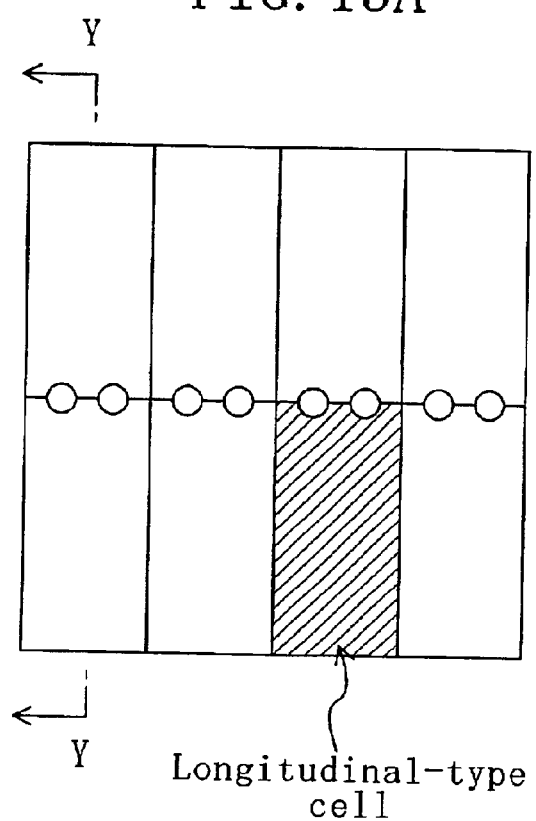
FIG. 13A is a top view schematically illustrating a structure of an SRAM device in which high-aspect-ratio memory cells (longitudinal-type cells) are arranged in a matrix pattern.
Figure 13B:
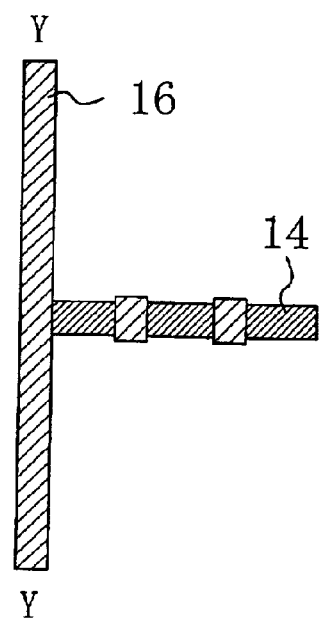
FIG. 13B is a cross-sectional view of a bit line that is provided along line Y—Y shown in FIG. 13A.

Next, the effect of reducing the line capacitance of the present embodiment will be described with reference to FIG. 10A. In FIG. 10A, the capacitance reduction rate is calculated for various values of M, used as a parameter, while assuming that K=0.7. Note that in FIG. 10A, it is assumed that the capacitance reduction rate is the same as the bit line delay reduction rate.

As illustrated in FIG. 10A, the capacitance reduction rate is 64% to 62% for values of M in the range of 1.5 to 2, which is close to the value in the case of a 0.15 ì m design rule. Therefore, if the bit line delay in the prior art is 1 nsec, it is expected that the bit line delay will be reduced to 0.64 to 0.62 nsec. Moreover, as illustrated in FIG. 10B, the power consumption can also be reduced in proportion to the reduction in the line capacitance of each bit line.

In the present embodiment, each data line is provided by using a bit line pair, as illustrated in FIG. 1B, since the present embodiment is directed to an SRAM device. However, the present invention is not limited to this. For example, in a ROM device, each data line is basically provided by using a single bit line. Particularly, since a ROM device has a high degree of integration, the number of contact plugs per unit bit line length is several times that of an SRAM device. Therefore, when the present embodiment is applied to a ROM device, it is quite effective in reducing the line capacitance of each bit line.

Particularly, in a semiconductor memory device used at a high operating speed, it is preferred that the variations in the bit line delay among different bit lines are as small as possible. In view of this, methods for making the bit line delay uniform will be shown below.

Method 1

A comparison between the bit line BLUn and the bit line BLDn of the present embodiment shows that the line capacitance of the bit line BLUn is greater than the line capacitance of the bit line BLDn by the line capacitance of the extended portion 16B. In view of this, according to the present method, the number of contact plugs to be provided for the bit line BLUn and that for the bit line BLDn are adjusted so that their line capacitances are equal to each other.

Where $N_1$ denotes the number of contact plugs to be provided for the bit line BLUn, and $N_2$ denotes that for the bit line BLDn. The ratio of the numbers of contact plugs at which the line capacitance $C_{BLUn}$ of the bit line BLUn and the line capacitance $C_{BLDn}$ of the bit line BLDn are equal to each other can be obtained as follows.

$$C_{BLUn} = C_{BLDn}$$

$$(1+M) \times N_1 + K \times N_2 = (1+M) \times N_2$$

$$N_2/N_1 = (1+M)/(1+M-K) \quad \text{(Expression 4)}$$

Therefore, it is preferred to arrange the bit lines so that the ratio $N_2/N_1$ is as shown in Expression 4 above. For example, $N_2/N_1 = 1.39$ where K=0.7 and M=1.5 in Expression 4 above. If the bit lines are arranged so as to satisfy $N_2/N_1 = 1.39$, the bit line delay can be reduced to be as small as 58%.

Method 2

In the present embodiment, the line capacitance of the bit line BLUn is greater than the line capacitance of the bit line BLDn by the line capacitance of the extended portion 16B. In view of this, according to the present method, the structure of the present embodiment is adjusted so that a larger cell current flows through memory cells that are connected to the bit line BLUn.

Figure 5:
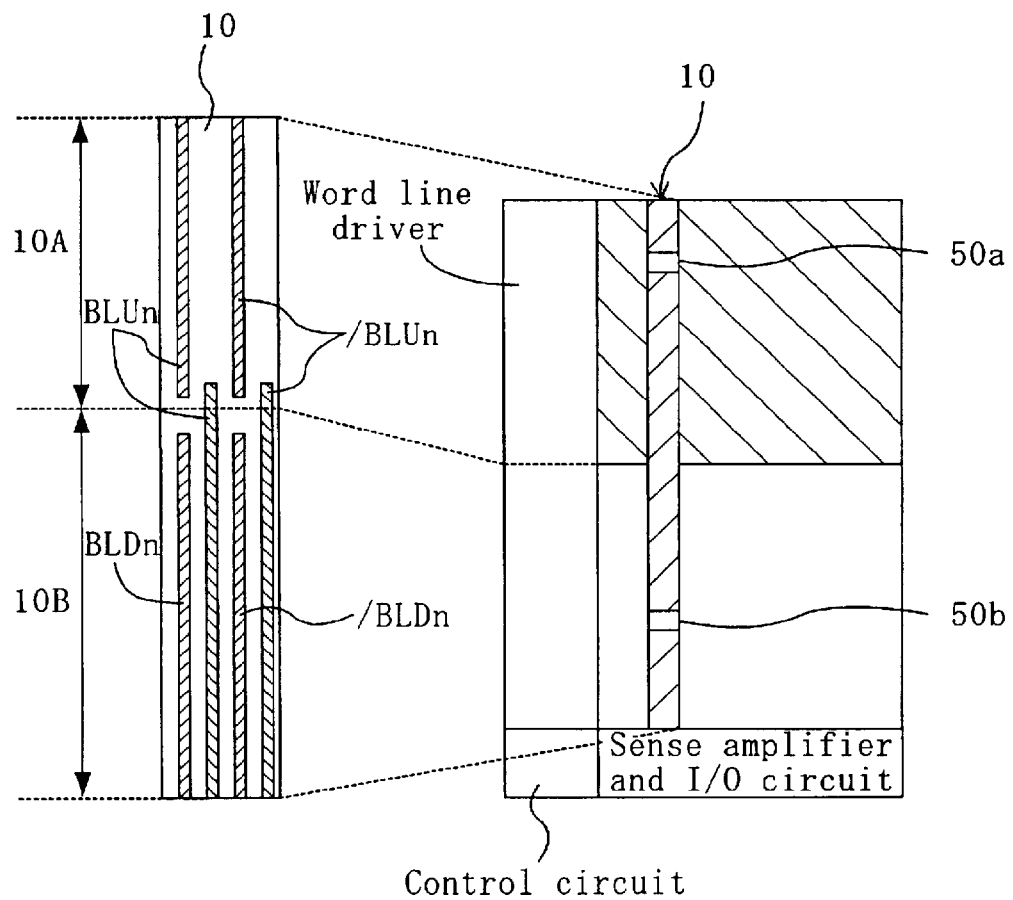
FIG. 5 is a schematic diagram illustrating a structure of the SRAM device of Embodiment 1.
Figure 6:
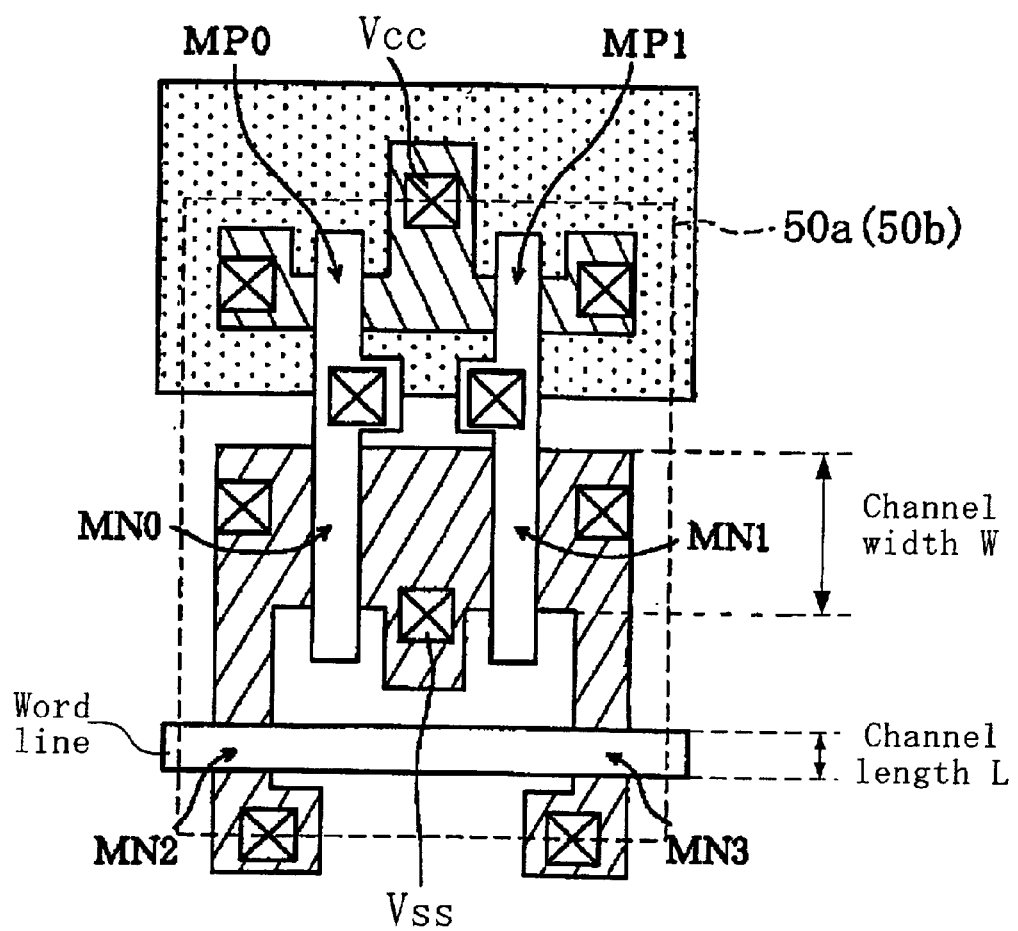
FIG. 6 is a top view illustrating a memory cell provided in the SRAM device of Embodiment 1.

Specifically, in a memory cell 50a connected to the bit line BLUn (i.e., each memory cell included in the region 10A of the memory cell group 10), the channel width W of the transistors MN0 and MN1 may be increased, or the channel length L thereof may be reduced, as illustrated in FIG. 5 and FIG. 6.

Specifically, the channel width W of the transistors MN0 and MN1 of the memory cell 50a connected to the bit line BLUn can be increased by adjusting the channel width W of the memory cell 50a connected to the bit line BLUn ("channel width Wa") and the channel width W of the memory cell 50b connected to the bit line BLDn ("channel width Wb") so as to satisfy Wa>Wb, as illustrated in FIG. 5 and FIG. 6.

In such a case, the area of each memory cell may need to be increased. In a case where the area of each memory cell needs to be increased, there may occur problems such as an increase in the total size of the SRAM device, or an increase in the total amount of leak current through the memory cells.

However, according to the present method, only the channel width of the transistors MN0 and MN1 of the memory cell 50a is increased, whereby it is possible to make the bit line delay uniform while minimizing such problems as described above.

Specifically, the channel length L of the transistors MN0 and MN1 of the memory cell 50a connected to the bit line BLUn can be reduced by adjusting the channel length L of the memory cell 50a connected to the bit line BLUn ("channel length La") and the channel length L of the memory cell 50b connected to the bit line BLDn ("channel length Lb") so as to satisfy La<Lb, as illustrated in FIG. 5 and FIG. 6.

Note that the present method is not limited to the method of reducing the channel length L of the transistors MN0 and MN1 of the memory cell 50a. As long as the threshold voltage of the transistors MN0, MN1, MN2 and MN3 is reduced (e.g., by reducing the thickness of the gate insulating film, by increasing the doping amount for the channel region, etc.), a large cell current flows, whereby the bit line delay can be made uniform as described above.

In addition, the present invention is applicable to a structure in which the bit line is not divided into the bit line BLUn and the bit line BLDn. In so doing, the channel width, the channel length or the threshold voltage is adjusted between the transistor of a memory cell that is located farther from the sense amplifier and the transistor of a memory cell that is located nearer to the sense amplifier so as to allow a larger cell current to flow through the memory cell transistor of a memory cell that is located farther from the sense amplifier, whereby it is possible to make the bit line delay uniform between memory cells connected to a single bit line and the sense amplifier.

Method 3

Figure 7A:
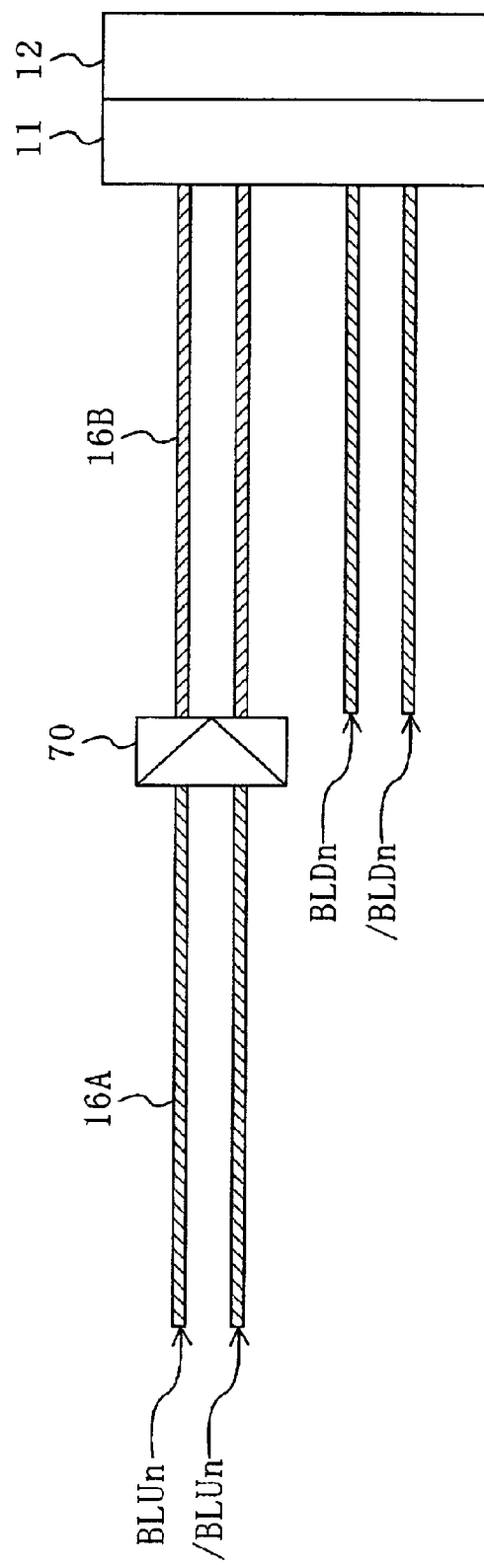
FIG. 7A and FIG. 7B are schematic diagrams each illustrating a structure of a bit line provided in the SRAM device of Embodiment 1.
Figure 7B:
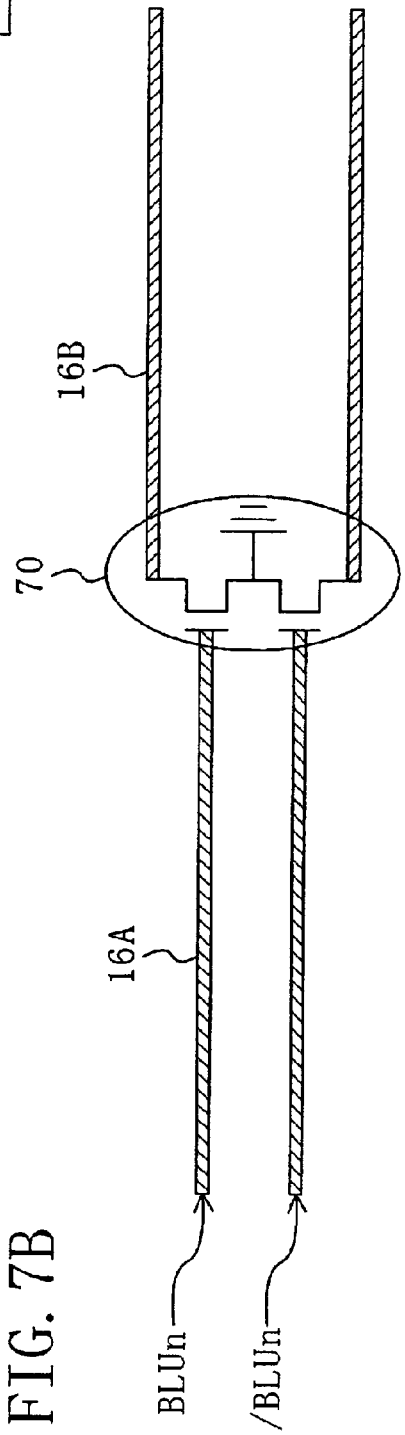

The bit line delay can be made uniform also by employing a structure in which the extended portion 16A of the bit line BLUn is connected to the extended portion 16B of the bit line BLUn via an amplifier 70, as illustrated in FIG. 7A. The amplifier 70 may be, for example, an amplifier including two MOS transistors, as illustrated in FIG. 7B.

Embodiment 2

An SRAM device of the present embodiment is different from the SRAM device 100 of Embodiment 1 above in that four bit line pairs (BL1, /BL1), (BL2, /BL2), (BL3, /BL3) and (BL4, /BL4) are provided in the memory cell group 10 illustrated in FIG. 1A. In each bit line pair, two bit lines are arranged in parallel to each other with a constant interval therebetween and are connected to the column switch 11.

Figure 8:
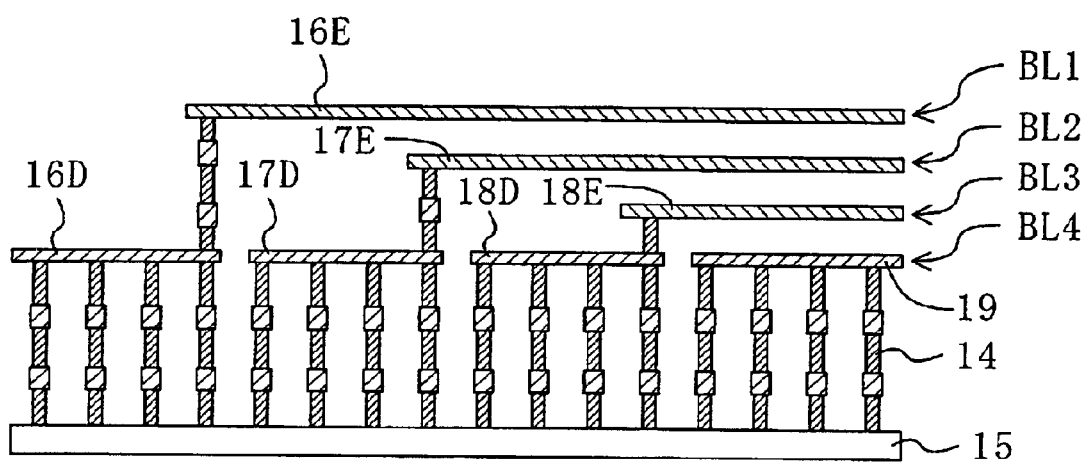
FIG. 8 is a cross-sectional view illustrating a structure of bit lines provided in an SRAM device of Embodiment 2.

FIG. 8 is a cross-sectional view illustrating a structure of bit lines provided in the memory cell group 10 according to the present embodiment.

As illustrated in FIG. 8, in the SRAM device of the present embodiment, the bit line in the memory cell group 10 is divided into four bit lines BL1, BL2, BL3 and BL4. The bit line BL1 includes extended portions 16D and 16E extending in the column direction along the memory cell group 10, and the contact plugs 14 each connected to an access transistor (not shown) of one of the memory cells formed on the Si substrate 15. Similarly, the bit line BL2 includes extended portions 17D and 17E and the contact plugs 14, and the bit line BL3 includes extended portions 18D and 18E and the contact plugs 14. The bit line BL4 includes an extended portion 19 and the contact plugs 14.

As illustrated in FIG. 8, the bit lines BL1, BL2, BL3 and BL4 are connected to the column switch 11 through four different wiring layers that are provided on four different levels in the layered device structure. A bit line having a contact plug located farther away from the column switch 11 than a contact plug of another bit line is connected to the column switch 11 through a wiring layer on a higher level. Note that the bit lines /BL1, /BL2, /BL3 and /BL4 have the same cross-sectional structure as that of the bit lines BL1, BL2, BL3 and BL4, respectively.

In the present embodiment, the extended portion 18E is shifted from the extended portion 19 as viewed from above. In other words, the extended portion 18E is offset from the extended portion 19 as viewed from above. The extended portion 17E is also offset from the extended portion 18E as viewed from above, and the extended portion 16E is also offset from the extended portion 17E as viewed from above. Thus, as viewed from above the memory cell, the extended portions 16E, 17E, 18E and 19 are arranged in parallel to one another with a constant interval therebetween.

In this way, the interval between the extended portion 16E and the extended portion 17E, that between the extended portion 17E and the extended portion 18E, and that between the extended portion 18E and the extended portion 19, are increased. Therefore, it is possible to reduce the coupling capacitance occurring between the extended portion 16E and the extended portion 17E, between the extended portion 17E and the extended portion 18E, and between the extended portion 18E and the extended portion 19.

In the present embodiment, the number of contact plugs for one bit line is reduced to ¼ of that of the conventional SRAM device illustrated in FIG. 3A. Thus, with the present embodiment, the number of contact plugs for one bit line can be reduced to ¼. Therefore, the line capacitance of each bit line can be reduced. Note that while the number of contact plugs for one bit line is set to be ¼ of that in the prior art in the present embodiment, the present invention is not limited to this, as long as four bit lines together include a number of contact plugs that are provided for one bit line in the prior art. In this way, the line capacitance of each bit line can be reduced.

The line capacitance of the bit line of the present embodiment will now be described with reference to FIG. 9.

As illustrated in FIG. 9, the bit lines BL1 to BL4 each include N/4 contact plugs 14. One contact plug 14 is provided for two memory cells.

Where K denotes the line capacitance of the extended portions 16E, 17E and 18E for two memory cells, and M denotes the line capacitance of the contact plug 14, with respect to the line capacitance of the extended portions 16D, 17D, 18D and 19 for one contact plug (for two memory cells) being 1, the line capacitance $C_{BL1}$ of the bit line BL1 is represented by Expression 5 below. Note that the line capacitance of the contact plug 14d is negligible and is thus ignored herein.

$$C_{BL1} = (1+M) \times N/4 + K \times 3N/4 \quad \text{(Expression 5)}$$

On the other hand, the line capacitance $C_{BL}$ of a bit line provided in the conventional SRAM device is represented by Expression 2 below.

$$C_{BL} = (1+M) \times N \quad \text{(Expression 2)}$$

Therefore, the ratio $C_{BL1}/C_{BL}$ of the reduced line capacitance of each bit line in the present embodiment with respect to that in the prior art can be represented by Expression 6 below.

$$C_{BL1}/C_{BL} = (1+M) \times N + 3KN/(1+M) \times 4N \quad \text{(Expression 6)}$$

Note that the line capacitance of the bit lines BL2 to BL4 is always smaller than the line capacitance of the bit line BL1. Therefore, the effect of reducing the line capacitance of each bit line in the present embodiment is dependent on the bit line BL1.

Next, the effect of reducing the line capacitance of the present embodiment will be described with reference to FIG. 10A. In FIG. 10A, the capacitance reduction rate is calculated for various values of M, used as a parameter, while assuming that K=0.7. Note that in FIG. 10A, it is assumed that the capacitance reduction rate is the same as the bit line delay reduction rate.

As illustrated in FIG. 10A, the capacitance reduction rate is 46% to 43% for values of M in the range of 1.5 to 2, which is close to the value in the case of a 0.15 ì m design rule. Therefore, if the bit line delay in the prior art is 1 nsec, it is expected that the bit line delay will be reduced to 0.46 to 0.43 nsec. Moreover, as illustrated in FIG. 10B, another significant effect is provided that the power consumption can also be reduced in proportion to the reduction in the line capacitance of each bit line.

Also in the present embodiment, Methods 1 to 3 of Embodiment 1 above may be employed so as to further reduce the bit line delay.

Specifically, in the present embodiment, a comparison between the line capacitance of each of the bit lines BL1, BL2 and BL3 and that of the bit line BL4 shows that the line capacitance of each of the bit lines BL1, BL2 and BL3 is larger than that of the bit line BL4 by the line capacitance of the corresponding one of the extended portions 16E, 17E and 18E. Such line capacitance variations among these bit lines can be corrected by adjusting the number of contact plugs for each of the bit lines BL1 to BL4 so that their line capacitances are substantially equal to one another as in Method 1 of Embodiment 1. In this way, the line capacitance of each bit line can be further reduced, and the bit line delay can be made uniform among different bit lines.

Alternatively, Method 2 of Embodiment 1 described above may be employed as follows. As described above, the line capacitance of each of the bit lines BL1, BL2 and BL3 is larger than that of the bit line BL4 by the line capacitance of the corresponding one of the extended portions 16E, 17E and 18E. In view of this, the structure of the present embodiment may be adjusted so that a larger cell current flows through memory cells that are connected to the bit lines BL1 to BL3. Particularly, in the structure of the present embodiment, the line capacitance increases from the bit line BL3 to the bit line BL1. Therefore, it is preferred that the cell current gradually increases from the memory cells that are connected to the bit line BL3 to the memory cells that are connected to the bit line BL1.

Furthermore, as in Method 3 of Embodiment 1 described above, the bit line delay can be made uniform by employing a structure in which the extended portions 16D, 17D and 18D of the bit lines BL1 to BL3 are connected respectively to the extended portions 16E, 17E and 18E of the bit lines BL1 to BL3 each via an amplifier.

The present invention has been described above through Embodiments 1 and 2 with respect to the bit line structure of an SRAM device. However, the present invention is not limited thereto, but may alternatively be applied to semiconductor memory devices other than an SRAM device (e.g., a highly-integrated mask ROM device). Moreover, each data line is provided by using a bit line pair through Embodiments 1 and 2, since the embodiments are directed to an SRAM device. However, the present invention is not limited to this. For example, in a ROM device, each data line is basically provided by using a single bit line.

What is claimed is:

1. A semiconductor memory device, comprising:

a substrate;

a plurality of memory cells arranged in a matrix pattern on a primary surface of the substrate;

a sense amplifier provided in each column for detecting data of the memory cells that are arranged along the column;

a plurality of wiring layers formed on the substrate; and a plurality of data lines provided in each column and connected to the memory cells that are arranged in the column, wherein the data lines are connected commonly to the sense amplifier but via different paths, and a data line having a longer path length is provided by using a wiring layer that is on a higher level.

2. The semiconductor memory device of claim 1, wherein:

the plurality of data lines each include contact plugs for connection to the plurality of memory cells that are arranged in one column; and a total line capacitance of each data line including the contact plugs is substantially equal to those of the other data lines.

3. The semiconductor memory device of claim 1, wherein in two data lines that are provided by using an upper wiring layer and a lower wiring layer vertically adjacent to the upper wiring layer, among the plurality of wiring layers, a portion provided through the upper wiring layer is offset from another portion provided through the lower wiring layer as viewed from above.

4. The semiconductor memory device of claim 1, wherein:

the memory cells each include a memory cell transistor; and a larger cell current flows through the memory cell transistor of a memory cell that is connected to a data line having a longer path length.

5. The semiconductor memory device of claim 4, wherein the memory cell transistor of a memory cell that is connected to a data line having a longer path length has a larger channel width.

6. The semiconductor memory device of claim 4, wherein the memory cell transistor of a memory cell that is connected to a data line having a longer path length has a smaller channel length.

7. The semiconductor memory device of claim 4, wherein the memory cell transistor of a memory cell that is connected to a data line having a longer path length has a lower threshold voltage.

8. The semiconductor memory device of claim 1, wherein an amplifier is provided along the path of at least one of the plurality of data lines.

9. The semiconductor memory device of claim 1, wherein the plurality of data lines are connected to the sense amplifier each via a column switch.

10. A semiconductor memory device, comprising:

a substrate;

a plurality of memory cells arranged in a matrix pattern on a primary surface of the substrate;

a sense amplifier provided in each column for detecting data of the memory cells that are arranged along the column; and a data line provided in each column and connected to the memory cells that are arranged in the column, wherein the memory cells each include a memory cell transistor, and a larger cell current flows through the memory cell transistor of a memory cell that is located farther from the sense amplifier.

11. The semiconductor memory device of claim 10, wherein the memory cell transistor of a memory cell that is located farther from the sense amplifier has a larger channel width.

12. The semiconductor memory device of claim 10, wherein the memory cell transistor of a memory cell that is located farther from the sense amplifier has a smaller channel length.

13. The semiconductor memory device of claim 10, wherein the memory cell transistor of a memory cell that is located farther from the sense amplifier has a lower threshold voltage.

* * * * *